(12) United States Patent
Padovani

(10) Patent No.: US 7,168,936 B2
(45) Date of Patent: Jan. 30, 2007

(54) LIGHT TRANSPARENT SUBSTRATE IMPRINT TOOL WITH LIGHT BLOCKING DISTAL END

(75) Inventor: Agnes M. Padovani, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 10/804,941

(22) Filed: Mar. 19, 2004

(65) Prior Publication Data

US 2005/0227497 A1 Oct. 13, 2005

(51) Int. Cl.
*B29C 59/02* (2006.01)

(52) U.S. Cl. .................. 425/174.4; 425/375; 425/385; 425/403

(58) Field of Classification Search ............ 425/174.4, 425/375, 384, 403, 385, 408, 415; 430/320; 438/754, 780

See application file for complete search history.

(56) References Cited

U.S. PATENT DOCUMENTS

| | | | | |
|---|---|---|---|---|
| 6,387,787 B1 * | 5/2002 | Mancini et al. | ............. | 438/586 |
| 6,716,754 B2 * | 4/2004 | Hofmann | .................... | 438/690 |
| 6,743,368 B2 * | 6/2004 | Lee | ............... | 216/2 |
| 6,871,558 B2 * | 3/2005 | Choi et al. | .................. | 73/865.8 |
| 6,957,608 B1 * | 10/2005 | Hubert et al. | ............... | 430/320 |

* cited by examiner

*Primary Examiner*—Ogendra N. Gupta
*Assistant Examiner*—Thu Khanh T. Nguyen
(74) *Attorney, Agent, or Firm*—Schwabe, Williamson & Wyatt, P.C.

(57) ABSTRACT

A substrate imprint tool is provided with a light transparent base and a light blocking distal end that is coupled to the light transparent base.

9 Claims, 12 Drawing Sheets

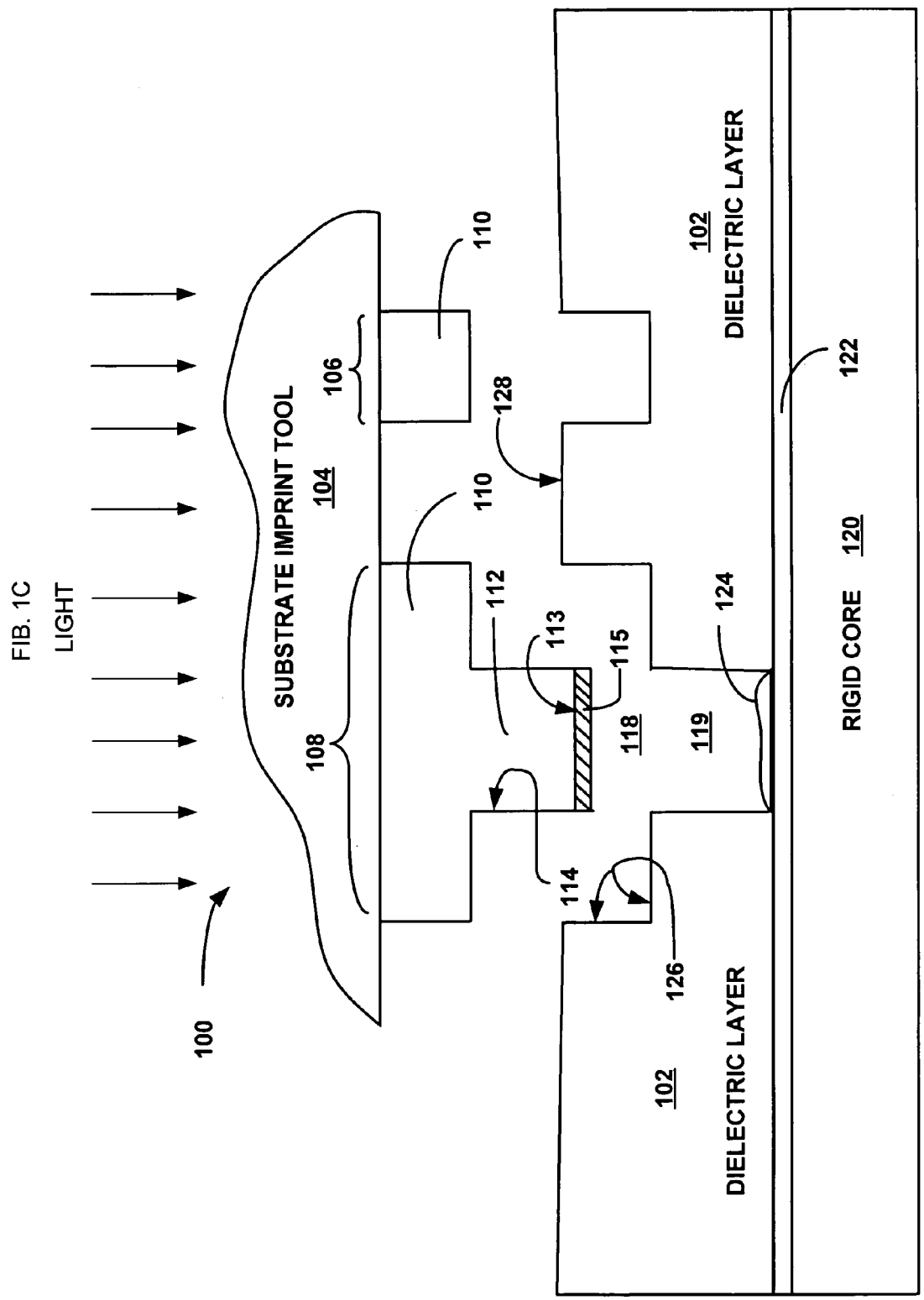

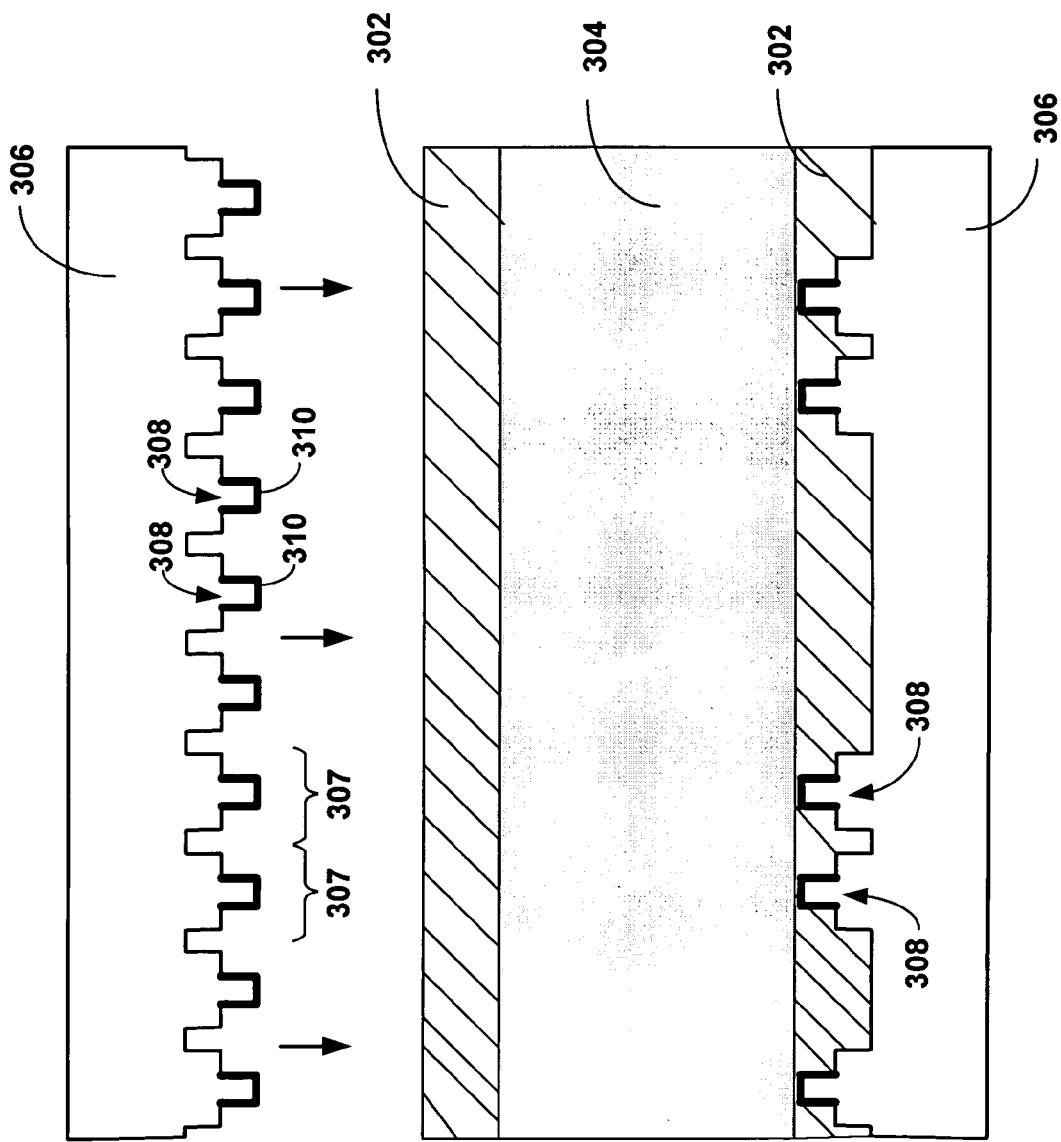

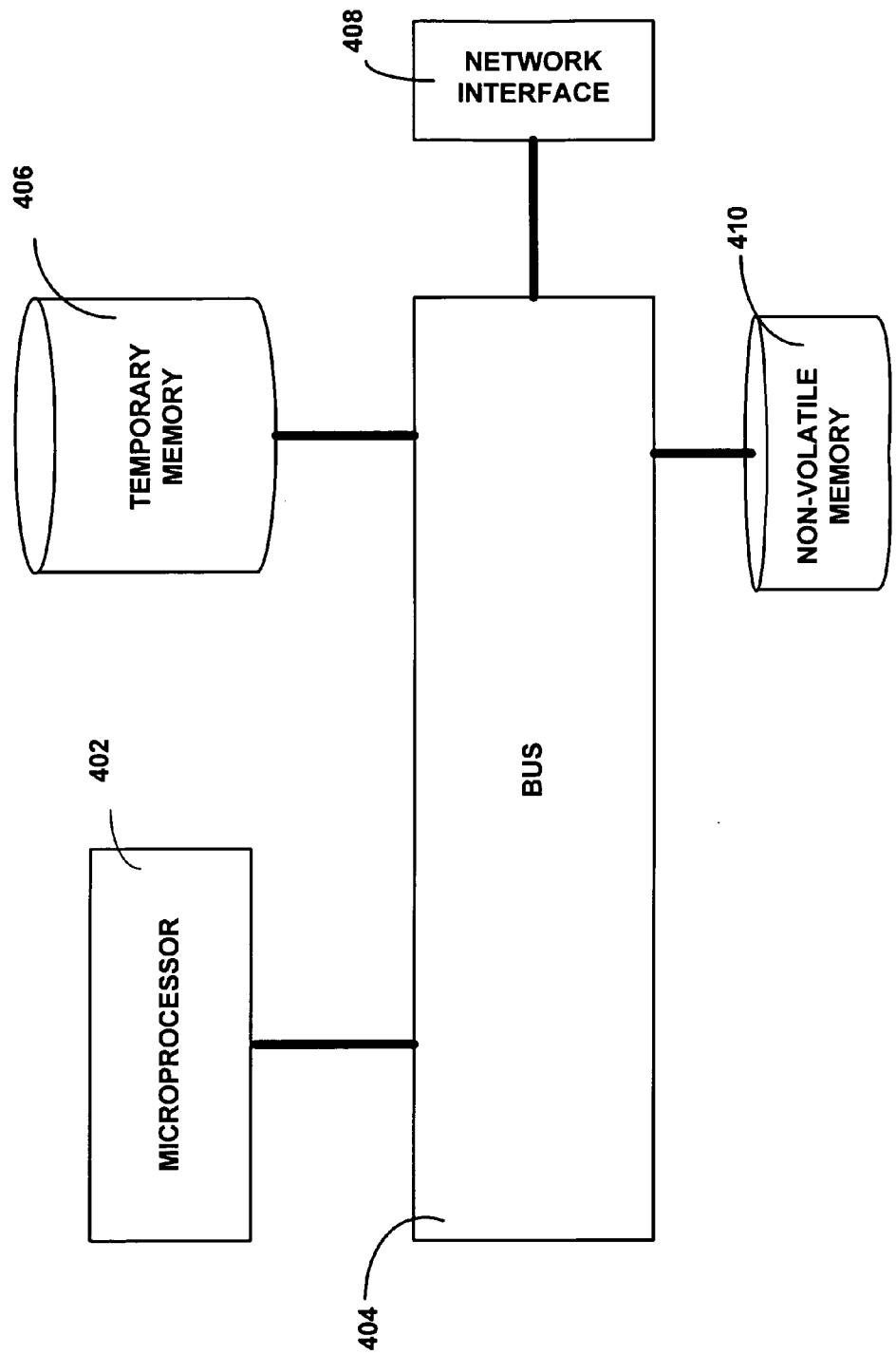

LIGHT TRANSPARENT SUBSTRATE IMPRINT TOOL WITH LIGHT BLOCKING DISTAL END

BACKGROUND OF THE INVENTION

1. Field of the Invention

The present invention relates to, but is not limited to, electronic device manufacturing, and in particular, to the field of circuitry imprinting.

2. Description of Related Art

The substrate imprinting technology is a relatively new technique for substrate build-up in which circuitry is directly printed into a dielectric material by means of a hot-embossing or imprinting process. This process uses a substrate imprint tool, which is typically made from a metal or an alloy such as nickel, to imprint circuitry features onto an insulation or dielectric (herein "dielectric") layer. The dielectric layer may be formed on top of a rigid core such as a substrate for an integrated circuit package. The circuitry features that are imprinted onto the dielectric layers may include features for interconnects such as vias and traces.

In cases where metal traces and vias are being formed, a substrate imprint tool may be used to imprint into the dielectric layer the circuitry features (in this case, via and trench recesses) that will be used to form the traces and vias. This is typically followed by a dielectric cure and an etch step that clears the circuitry features before a metal plating process, which creates the electrical interconnects.

BRIEF DESCRIPTION OF THE DRAWINGS

Embodiments of the present invention will be described referencing the accompanying drawings in which like references denote similar elements, and in which:

FIG. 1C illustrates a substrate imprint tool and circuitry features on a dielectric material according to an embodiment;

FIGS. 3A to 3G illustrates the formation of traces and vias on the dielectric material at different stages of the process of FIG. 2 according to some embodiments; and FIG. 4 is a block diagram of an example system, according to some embodiments.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

According to some embodiments of the invention, a novel substrate imprint tool is provided comprising of both light transparent and light blocking components. For these embodiments, light may be defined as all forms of electromagnetic radiation such as, but not limited to, ultraviolet (UV) radiation, infrared, visible, and the like. Such an imprint tool may allow for imprinting of circuitry features onto a dielectric material, such as the dielectric material that may be found on package substrates, and at least partial curing of the dielectric material during a single process step.

For these embodiments, the substrate imprint tool may comprise a light transparent base and one or more imprint features coupled to the light transparent base, where each of the one or more imprint features may be employed to define circuitry features such as vias and traces. Each of the one or more imprint features may include a light transparent neck component and/or a light blocking distal end. If a light blocking distal end is present in an imprint feature, the light blocking distal end may be located at one end of the light transparent neck component, which in turn may be coupled to the light transparent base at the opposite end.

According to some embodiments, by incorporating light transparent and light blocking components into a substrate imprint tool, different portions of a dielectric material being imprinted may be selectively cured during the imprinting process while leaving other portions of the dielectric material in an uncured state. For these embodiments, the dielectric material may be partially cured by exposing the dielectric material to light such as UV radiation through the light transparent portions of the substrate imprint tool. In doing so, the structural integrity of some of the resulting circuitry features may be maintained while leaving other features, such as undesirable features like chads, in an uncured state for subsequent removal. The remaining cured circuitry features on the dielectric material may be used to form circuit components such as vias and traces. In other embodiments of the invention, the light transparent component of the substrate imprint tool may comprise of material that is substantially transparent to certain electromagnetic radiation having wavelengths that cures the dielectric material.

Figure 1A:
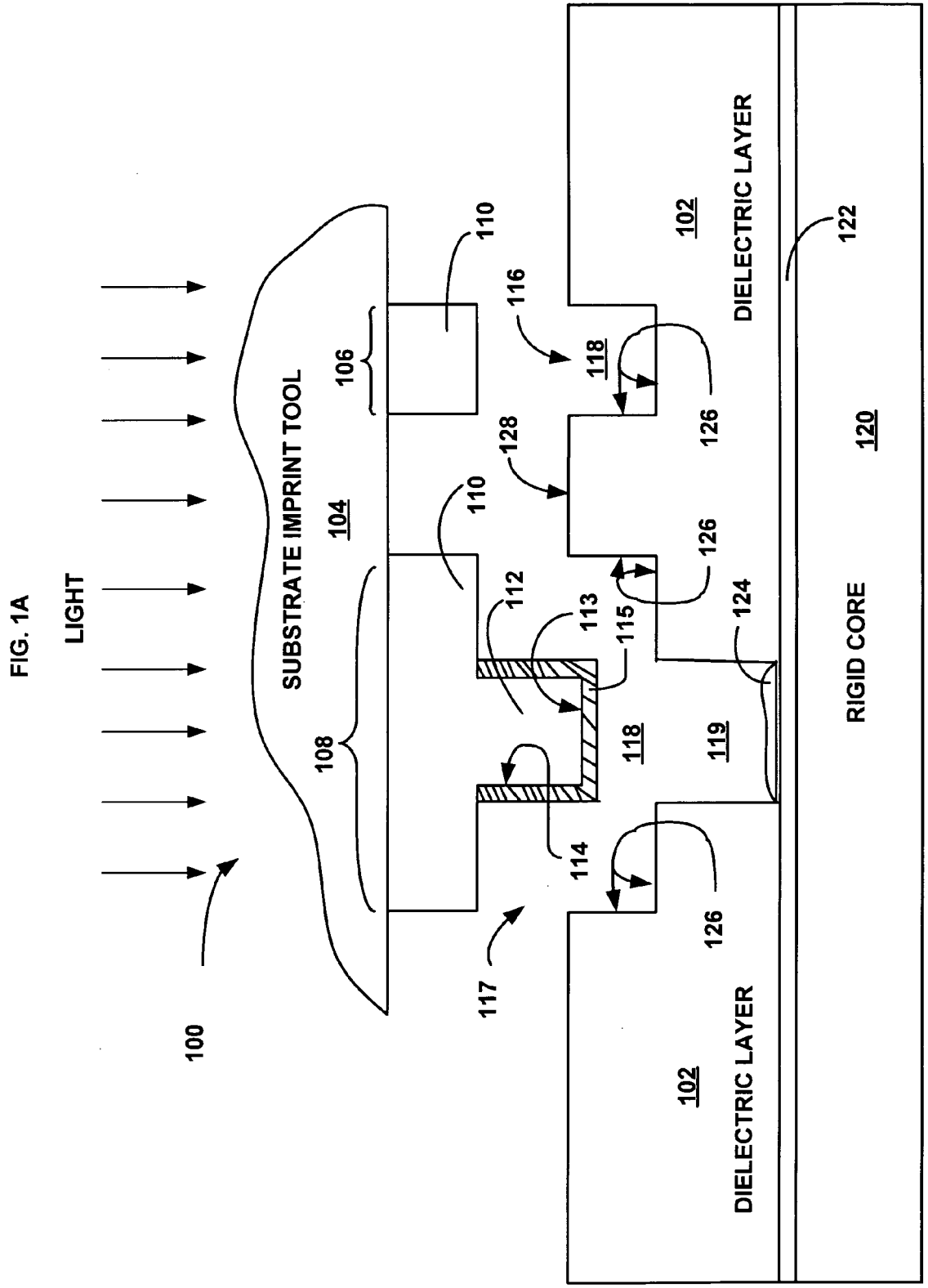
FIG. 1A illustrates a substrate imprint tool and circuitry features on a dielectric material according to an embodiment.
Figure 3A:
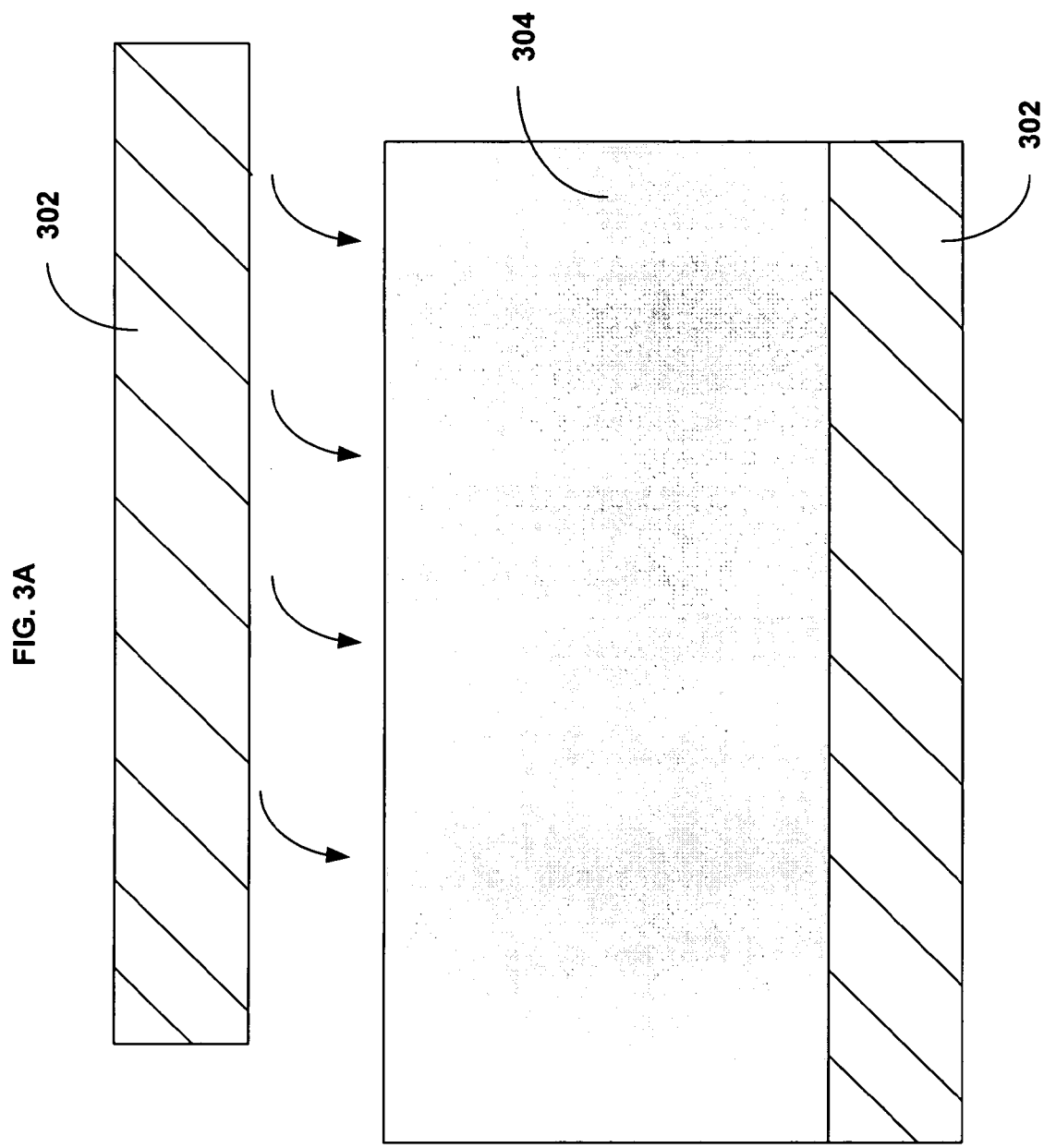
Figure 3C:
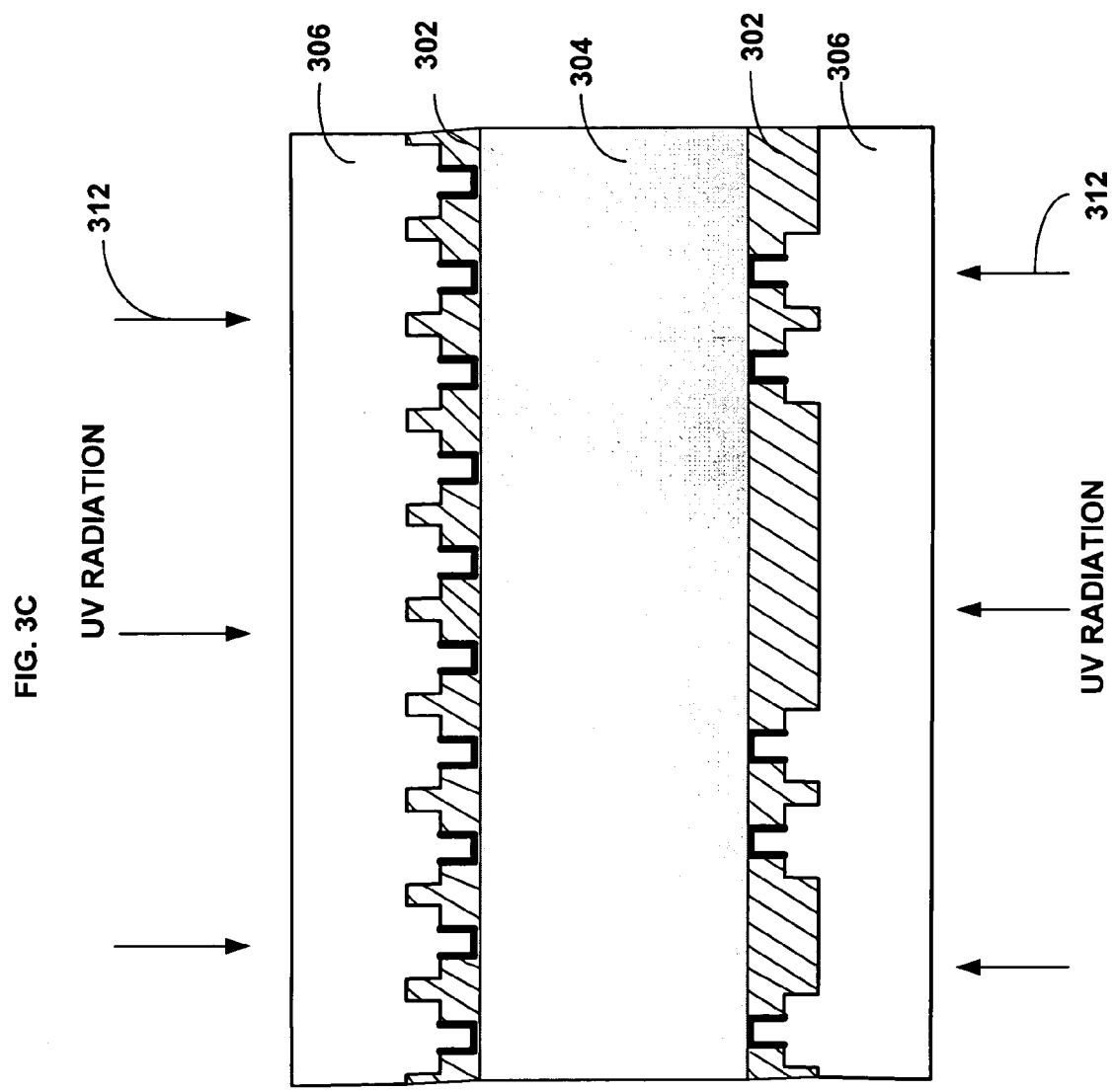

FIG. 1A depicts a substrate imprint tool 100 that allows for imprinting and at least partial light curing of a dielectric layer 102 during a single process step according to one embodiment of the invention. For the embodiment, the substrate imprint tool 100 may be used to form circuitry features that may include trace and via circuitry features (i.e., the recesses that may be used to form traces and vias) in the dielectric layer 102. The substrate imprint tool 100 comprises a light transparent base 104 and two imprint features 106 and 108 (note that in other embodiments, the substrate imprint tool may have fewer or more imprint features as depicted in FIGS. 3B to 3C). The first imprint feature 106 comprises a light transparent neck component 110. The second imprint feature 108, on the other hand, comprises a light transparent neck component 110 and a light blocking distal end 112. The light blocking distal end 112 includes a light transparent core coated with a coating 115 of light blocking material.

In the second imprint feature 108, the light transparent neck component 110 is located between the light transparent base 104 and the light blocking distal end 112, with the light transparent neck component 110 being wider than the light blocking distal end 112. The light blocking distal end 112 is located at a distal end of the substrate imprint tool 100 and having a bottom surface 113 and a side surface 114.

For the embodiment, the light transparent base 104 and the light transparent neck components 110 may be comprised of a material that is transparent to light such as silica-based materials (e.g., glass). Such materials may include the glass material used for forming a mask in photolithography processes. The core portion of the light blocking distal end 112 may be made of the same light transparent material that make up the light transparent base 104 and the light transparent neck components 110. Again, as described above, the core portion of the light blocking distal end 112 may have a coating 115 of a light blocking material such as metals including chrome, aluminum, copper, titanium, gold, nickel and the like, alloys, paint, and/or other suitable materials for blocking light.

For the embodiment, the substrate imprint tool 100 depicted in FIG. 1A may be used to imprint two circuitry features 116 and 117 in the dielectric layer 102. The first circuitry feature 116 comprises a trace recess 118 (which may be eventually used to form a trace), while the second circuitry feature 117 comprises a trace recess 118 and a via recess 119 (which may be eventually used to form a via). The via recess 119 that is formed may reach down to a rigid core 120 which may be a substrate such as the substrate for an integrated circuit package. The rigid core 120 may further include other components such as a conductive layer 122 or other components that may interface with the bottom of the via recess 119. After the dielectric layer 102 has been imprinted, a small amount of dielectric material, called a chad 124, may be left at the bottom of the via recess 119. If the chad 124 is allowed to remain at the bottom of the via recess 119, then it may prevent good electrical contact between the via (that may be subsequently formed in the via recess 119) and other components such as the conductive layer 122.

For some embodiments, when a dielectric layer 102 is initially formed or deposited on a rigid core 120, the dielectric material that comprises the dielectric layer 102 may be in a semi-solid or b-staged state. Therefore, in order to prevent the wash-out (e.g., warping or deforming) of circuitry features during the imprinting and/or subsequent curing process, the curing of the dielectric layer 102 may be performed while the substrate imprint tool 100 is still in contact with the dielectric layer 102. The curing of the dielectric layer 102 during the imprinting process may maintain the structural integrity of the imprinted circuitry features 116 and 117.

For these embodiments, at least partial curing of the dielectric layer 102 may be performed during the imprinting process of the dielectric layer 102. This may be accomplished by exposing portions of the dielectric layer 102 to light through the light transparent portions of the substrate imprint tool 100. That is, while the substrate imprint tool 100 is still in contact with the dielectric layer 102 during imprinting, electromagnetic radiation, such as UV radiation, may be directed through the transparent portions of the substrate imprint tool 100 and onto the dielectric layer 102. As a result, only the portions of the dielectric layer 102 that interface with those transparent portions of the substrate imprint tool 100 may be cured. For the embodiment, only the dielectric material that is located on the walls 126 of the trace recesses 117 and 116, and the top surface 128 of the dielectric layer 102 may be cured. On the other hand, the dielectric material at the side walls and bottom surface of the via recess 119, such as the chad 124, may remain uncured because of the coating 115 of light blocking material that coats the light blocking distal end 112 of the substrate imprint tool 100. Once the simultaneous imprinting and partial curing process has been completed, the uncured chad 124 that remains at the bottom of the via recess 119 may be removed using, in one embodiment, a solvent material that is able to dissolve the uncured dielectric material that comprises the chad 124. Note that the phrase "simultaneous imprinting and partial curing process" means that the partial curing process may occur at the same time as the imprinting process and/or after the completion of the imprinting process, while the substrate imprint tool 100 is still in contact with the dielectric layer 102.

Figure 1B:
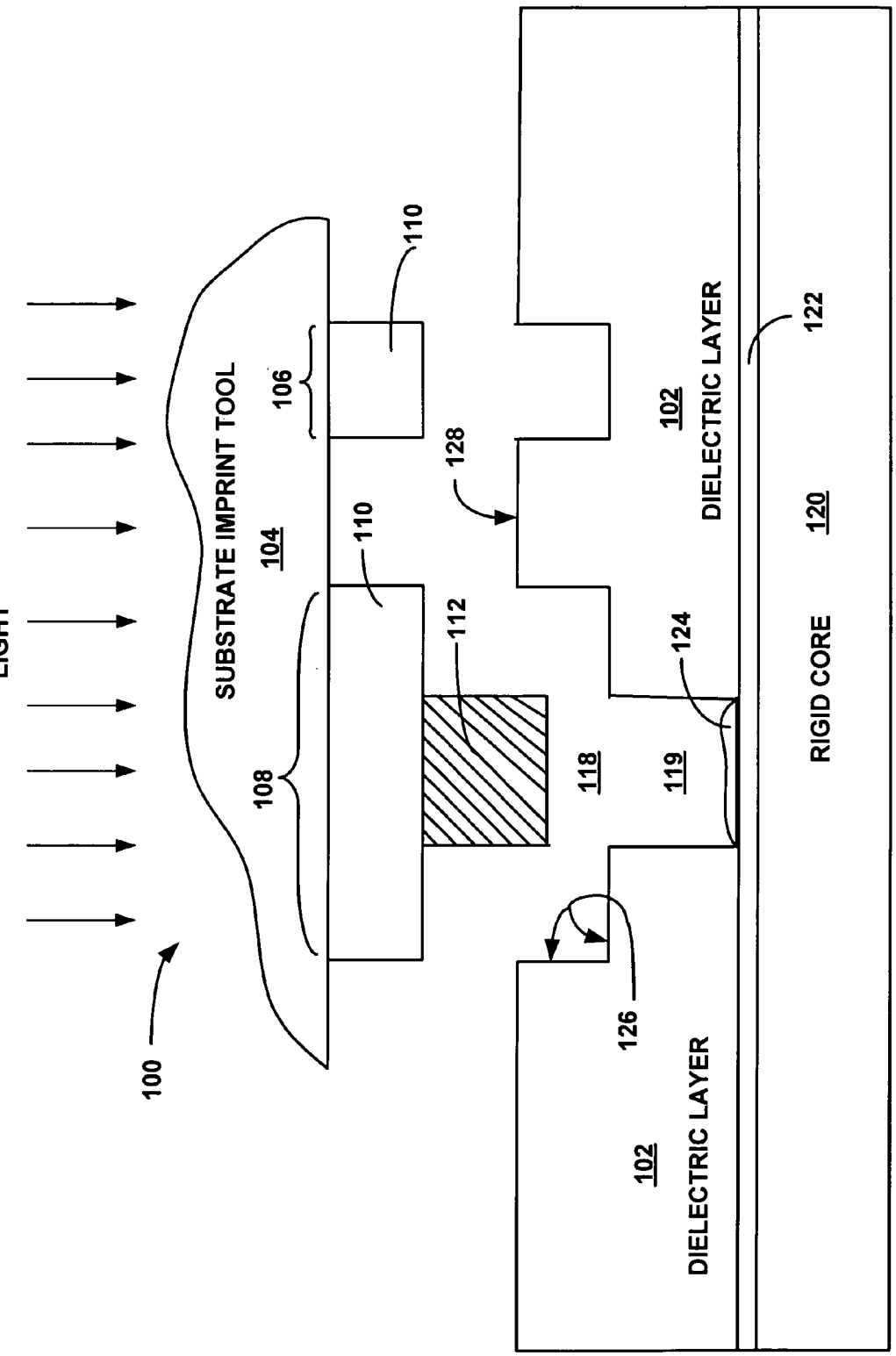
FIG. 1B illustrates a substrate imprint tool and circuitry features on a dielectric material according to an embodiment.

Although the light blocking distal end 112 of the substrate imprint tool 100 in FIG. 1A is depicted as comprising a light transparent core coated with a coating 115 of a light blocking material, different structures for the light blocking distal ends may be incorporated in other embodiments. FIG. 1B depicts a substrate imprint tool 100 that includes a light blocking distal end 112 comprising entirely of light blocking material according to another embodiment. In contrast, FIG. 1C depicts a substrate imprint tool 100 that includes a light blocking distal end 112 having a coating 115 of light blocking material only at the bottom surface 113 of the light blocking distal end 112 in yet another embodiment. In both embodiments, the chad 124 that remains at the bottom of the via recess 119 after the completion of the simultaneous imprinting and partial curing process may remain uncured. By only curing the walls of the trace recess 118 and top surface 128, the structural integrity of certain portions of the dielectric layer 102 may be maintained thus avoiding wash-outs of the imprinted features. In each case, the removal of the uncured chad 124 may be effectuated by subsequent developing and/or rinsing processes that may dissolve the uncured chad 124.

Figure 2:
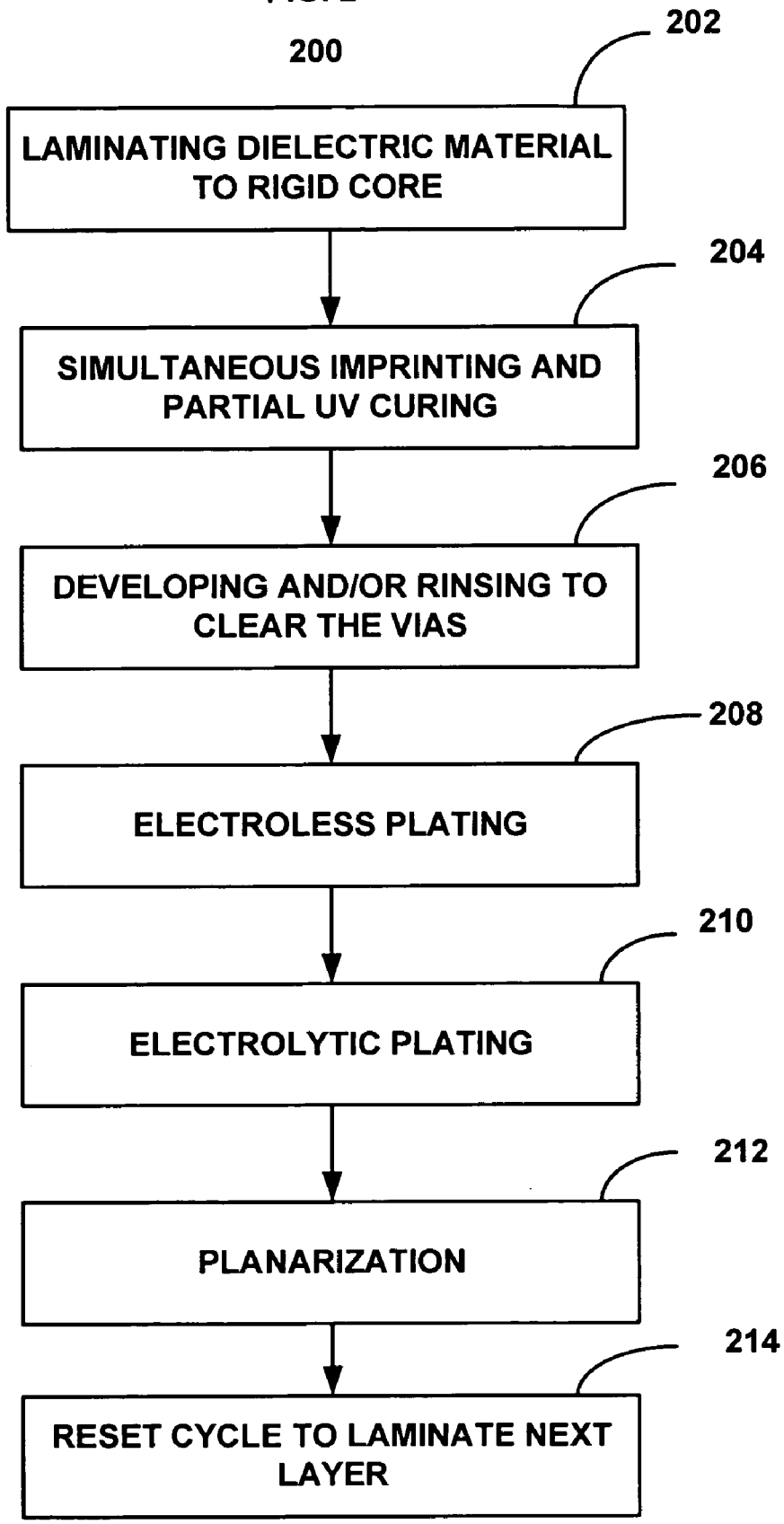
FIG. 2 illustrates a process for forming traces and vias on a dielectric material using a simultaneous imprinting and partial curing process according to some embodiments.

Referring to FIG. 2, which is a process for forming traces and vias on a dielectric material using simultaneous imprinting and partial UV curing processes according to some embodiments. According to one embodiment, the rigid core may be the core of an integrated circuit package substrate. FIGS. 3A to 3G are cross sectional views of structures associated with the different stages of the process flow depicted in FIG. 2. Note that although the process depicted in FIG. 2 uses UV curing, other forms of electromagnetic radiation may be used for the curing process.

The process 200 may begin when a dielectric layer 302 is laminated or formed onto a rigid core 304 (see FIG. 3A) at 202. The rigid core 304, which may be the core of an integrated circuit package substrate, may further include a number of components such as conductive layers, trenches, traces, vias, capacitors, resistors, and the like. According to some embodiments of the invention, the dielectric layer 302 comprises of photo-crosslinkable dielectric material. Photo-crosslinkable materials may be polymers that may crosslink upon exposure to electromagnetic radiation such as UV radiation. For these embodiments, certain dielectric polymers, such as but not limited to, polyimides, polyamides, parylenes, polyarylethers, polynaphthalenes, polyquinolines, bisbenzocyclobutene, polyphenylene, polyarylene, their copolymers or their porous polymers, may be suitable for such purposes. The dielectric layer 302 may be formed and/or deposited using conventional techniques such as, but not limited to, vacuum lamination, chemical vapor deposition or spin-on processes.

Once the dielectric layer 302 has been laminated or formed onto the rigid core 304, simultaneous imprinting and partial curing of the dielectric layer 302 may be performed at 204 (see FIGS. 3B and 3C). That is, the partial curing process may be performed at the same time as the imprinting process or immediately after the imprinting process while the substrate imprint tool 306 is still imbedded in the dielectric layer 302. For the embodiment, the simultaneous imprinting and partial curing process may be performed using a substrate imprint tool 306 that comprises both UV transparent and UV blocking components. FIGS. 3B and 3C depict two substrate imprint tools 306 being used to imprint on two dielectric layers 302 formed on the rigid core 304. The two substrate imprint tools 306 having multiple imprint features 307. The substrate imprint tools 306 may generally comprise of UV transparent material except that the distal ends 308 of the substrate imprint tools 306 are coated with a coating 310 of UV blocking material. While the substrate imprint tool 306 is still in contact with the dielectric layer 302, electromagnetic radiation 312, such as UV radiation, may be directed to the dielectric layer through the substrate imprint tool 306 as indicated by 312 in FIG. 3C. Only the dielectric material that interfaces with the UV transparent portions of the substrate imprint tool 306 may be cured. In contrast, the dielectric material that interfaces with the portions of the substrate imprint tool 306 that comprises of UV blocking material (i.e., UV blocking distal ends 308) will remain uncured.

Figure 3D:
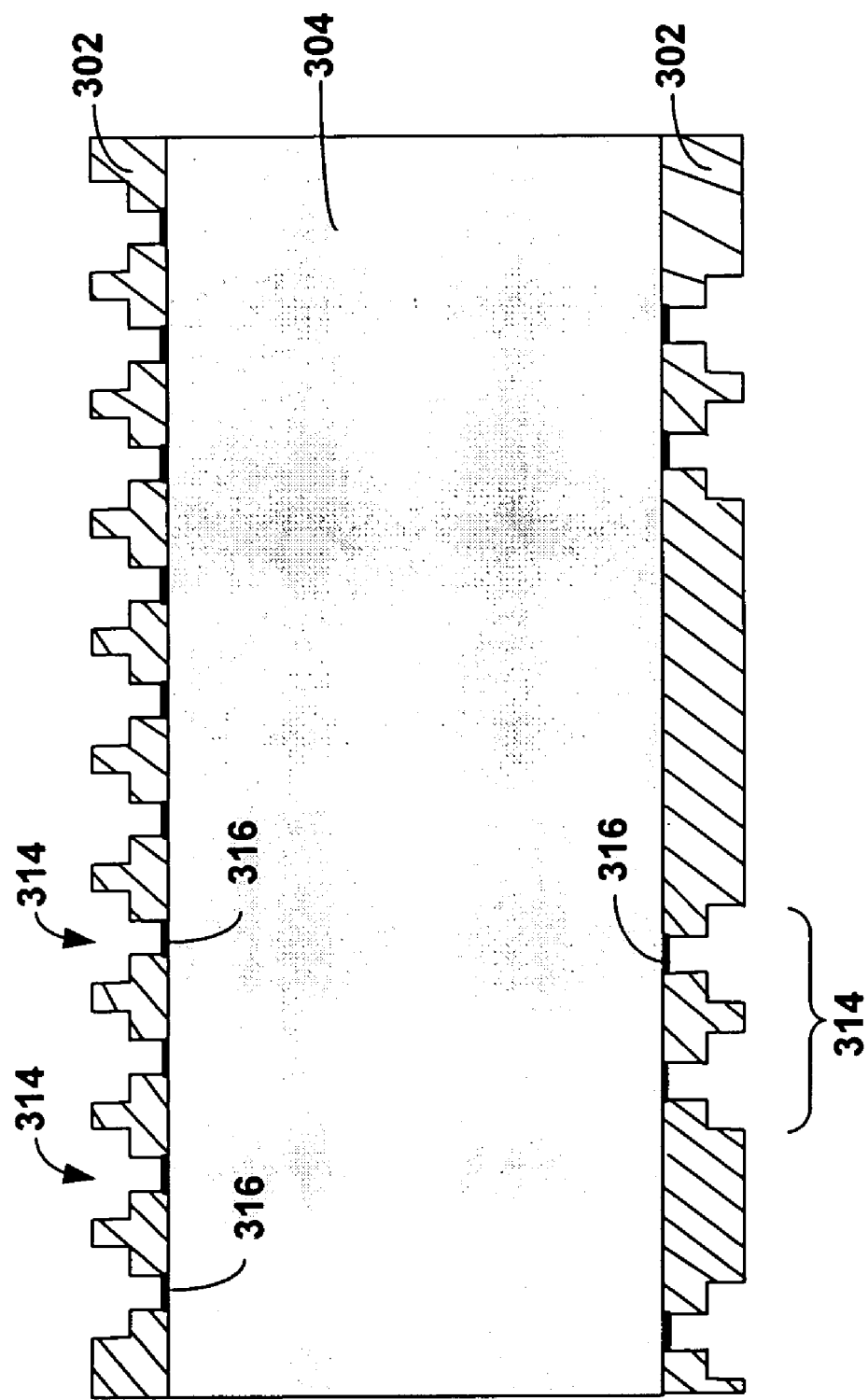

Once the dielectric layer 302 has been partially cured or in the case of a polymer dielectric, cross-linked, the substrate imprint tool 306 may be retracted from the dielectric layer 302 leaving behind circuitry features 314 on the dielectric layer 302 (see FIG. 3D). The circuitry features 314 may include a trace recess and a via recess that may contain a chad 316 at the bottom of the via recess. As a result of the UV blocking distal ends 308, the chad 316 may remain uncured.

The uncured chad 316 at the bottom of the via recess, which may extend down to the rigid core 304, may be removed using, in one embodiment, a developing and/or rinsing process that uses a solvent material solution to dissolve the uncured chad material at 206. The solution used for developing and/or rinsing the circuitry features 314 may be a solution that dissolves uncured dielectric material but does not dissolve cured dielectric material.

Figure 3E:
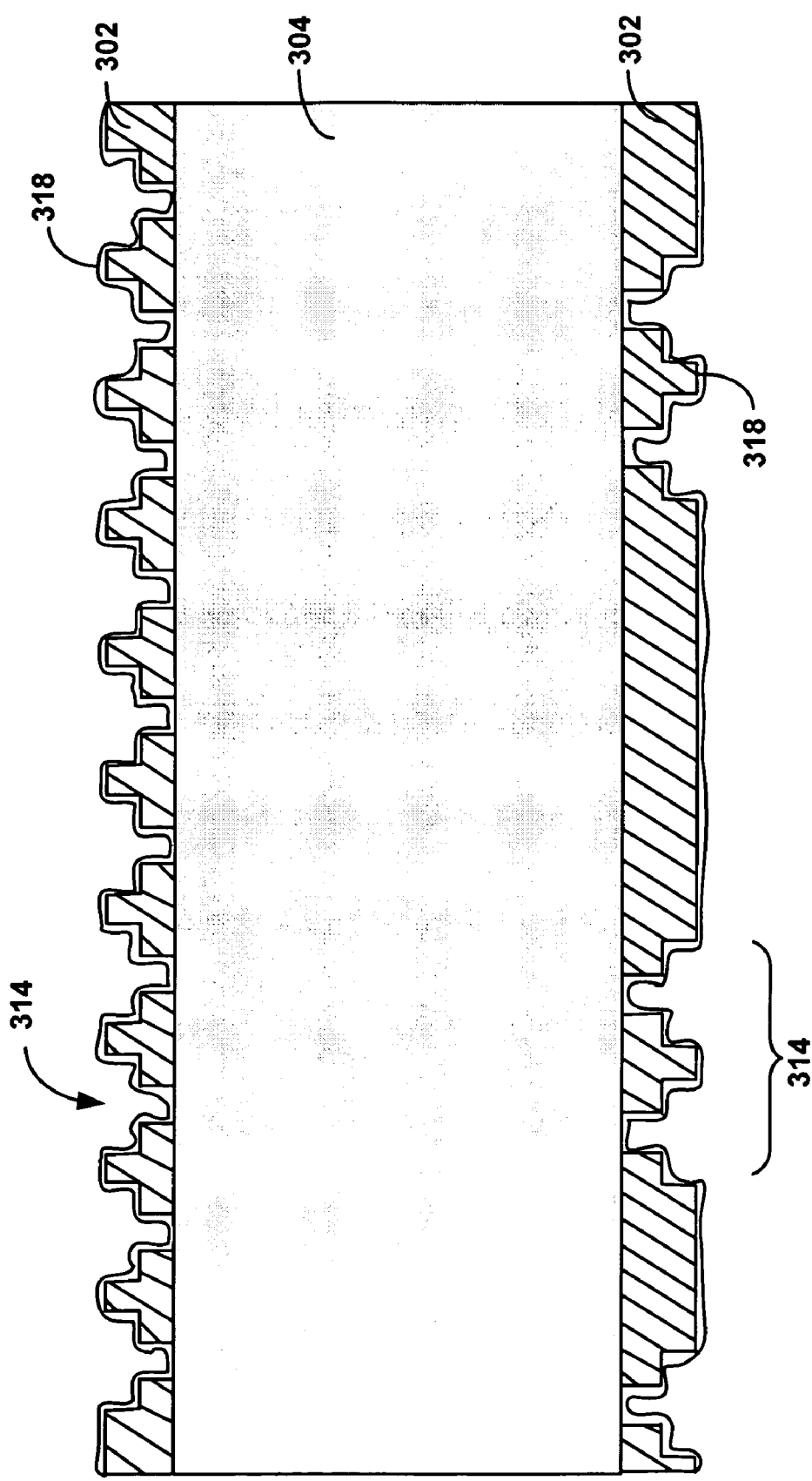

After the removal of the chads 316 from the bottom of the via recesses, electroless metal plating may be performed on the circuitry features at 208 (see FIG. 3E). The electroless metal plating may be performed in order to deposit a conductive seed film 318 onto the dielectric layer 302. The seed film 318 may be provided as a preparation for plating techniques. In one embodiment, the seed film 318 comprises of a conductive material, such as copper, that is formed by processes such as, but not limited to, chemical reaction, chemical vapor deposition (CVD) or physical vapor deposition (PVD) techniques.

Figure 3F:
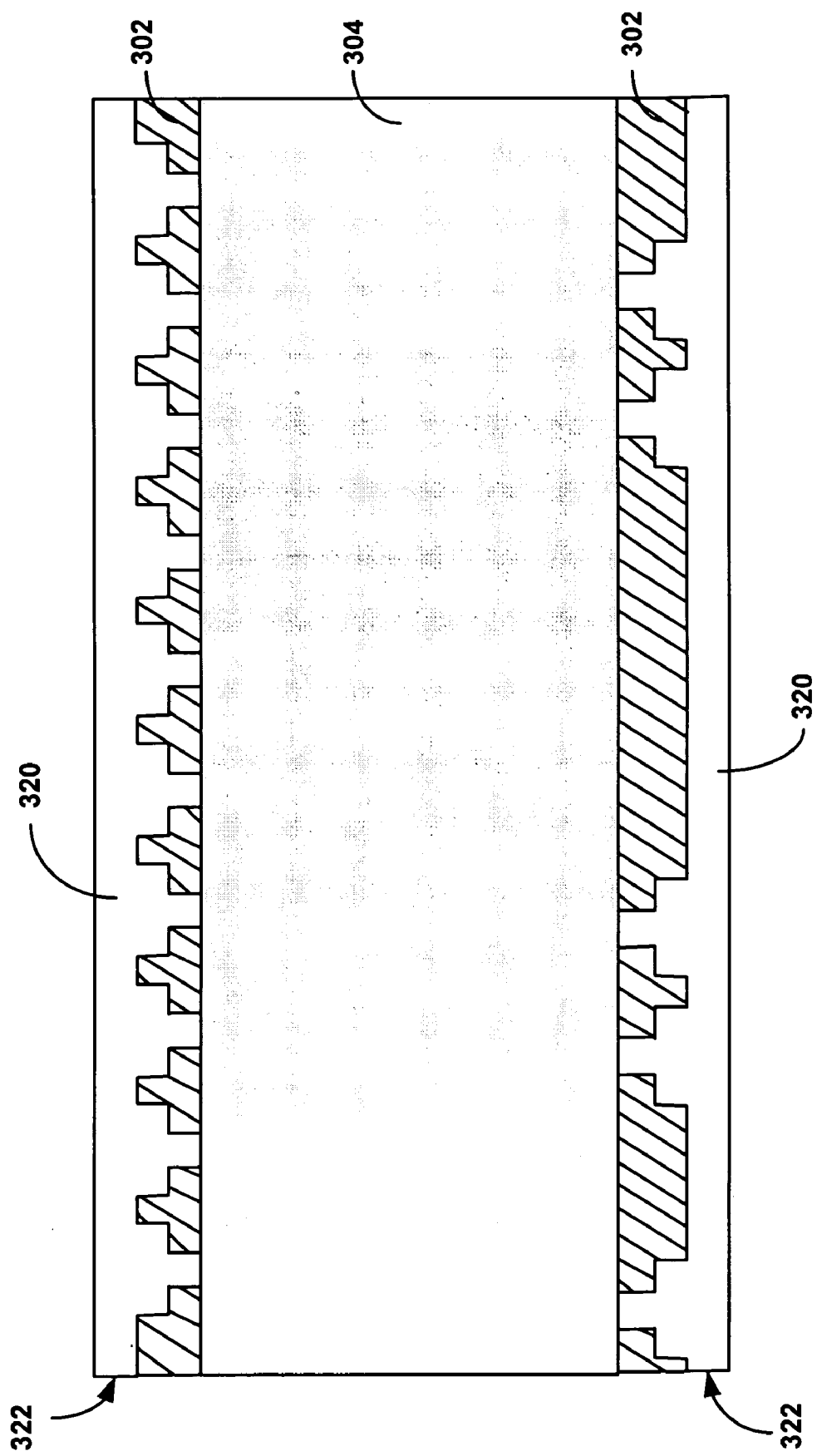

Upon the deposition of the seed film 318, electrolytic metal plating of the circuitry features on the dielectric layer 302 may be performed at 210 (see FIG. 3F). The electroplating process 210 may deposit electroplated material 320 onto the seed film 318 on the dielectric layer 302. According to some embodiments, the process 210 may be carried out by immersing or contacting the circuitry features 314 on the dielectric layer 302 with an aqueous solution containing metal ions, such as copper sulfate-based solution, and reducing the ions onto a cathodic surface. Various metals such as tungsten (W), copper (Cu), silver (Ag), gold (Au), aluminum (Al), titanium (Ti), and their alloys may be used as electroplating materials. In addition, copper alloys such as copper-magnesium, copper-nickel, copper-tin, copper-indium, copper-cadmium, copper-zinc, copper-bismuth, copper-ruthenium, copper-tungsten, copper-cobalt, copper-palladium, copper-gold, copper-platinum, and copper-silver may also be used. Once the electroplated material 320 has been deposited onto the circuitry features 314 of the dielectric layer 302, an overplate (i.e., excess) 322 of the electroplated material may be present on top of the dielectric layer 302. Note that in other embodiments, the electroless and electroplating processes 208 and 210 depicted in FIGS. 2, 3E and 3F, may be replaced by other processes for depositing conducting material onto the circuitry features 314.

Figure 3G:
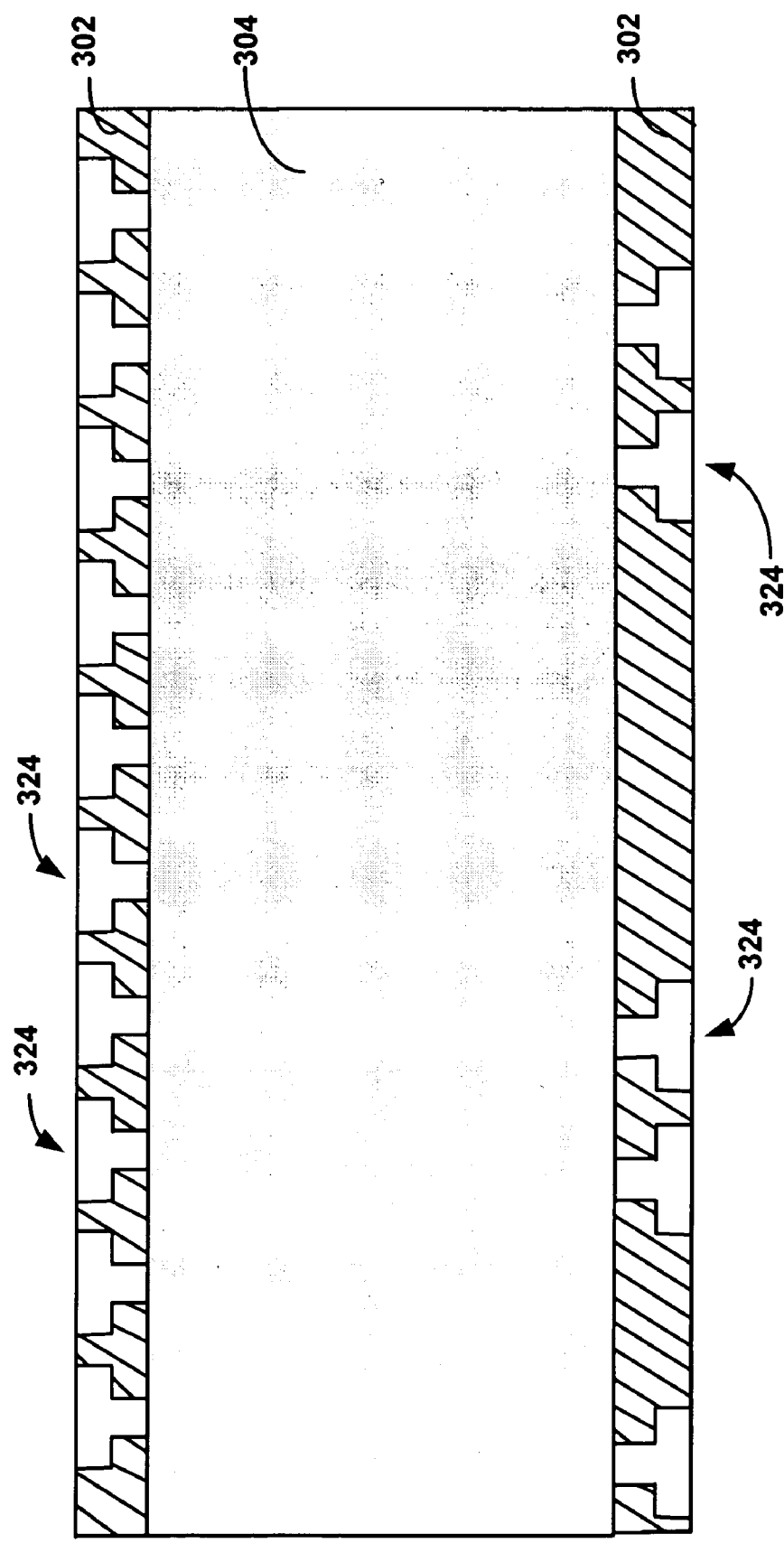

Following the deposition of electroplated material 320, the deposited electroplated material 320 may be planarized at 212 (see FIG. 3G). The planarization process 212 may remove the excess overplate 322 that may be present on top of the dielectric layer 302. One such planarization process 212 is chemical mechanical polishing (CMP). For the embodiment, after the completion of the planarization process 212, a layer (or in the embodiment depicted in FIG. 3G, two layers on either side of the rigid core 304) of vias and traces 324 are formed. Finally, the entire process 200 for forming vias and traces using partial UV curing may be repeated in order to form another layer of vias and traces on top of the layer of vias and traces 324 previously formed at 214.

Referring now to FIG. 4, where a system 400 in accordance with some embodiments is shown. The system 400 includes a microprocessor 402 that may be coupled to a bus 404. The system 400 may further include temporary memory 406, a network interface 408, and a non-volatile memory 410. One or more of the above enumerated elements, such as microprocessor 402, temporary memory 406, and so forth, may be packaged as part of a package substrate that was formed using the novel substrate imprint tools and/or the simultaneous imprinting and partial curing processes described above.

Depending on the applications, the system 400 may include other components, including but not limited to, chipsets, RF transceivers, mass storage (such as hard disk, compact disk (CD), digital versatile disk (DVD)), graphical or mathematic co-processors, and so forth, all of which may be coupled to a package substrate formed using the novel substrate imprint tools and/or the simultaneous imprinting and partial curing processes described above.

In various embodiments, the system 400 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A substrate imprint tool, comprising:
   a light transparent base;
   a light blocking distal end coupled to the light transparent base to block electromagnetic radiation directed through the light transparent base; and
   a light transparent neck component formed between the light blocking distal end and the light transparent base, the light transparent neck component being narrower than the light transparent base and wider than the light blocking distal end.

2. The substrate imprint tool of claim 1, wherein the light transparent neck component is configured to define a trace recess.

3. The substrate imprint tool of claim 1, wherein the light transparent neck component comprises glass.

4. The substrate imprint tool of claim 1, wherein the light transparent base comprises glass.

5. The substrate imprint tool of claim 1, wherein the light blocking distal end is configured to define a via recess.

6. The substrate imprint tool of claim 1, wherein the light blocking distal end further comprises a light transparent core coated with a light blocking material.

7. The substrate imprint tool of claim 1, wherein the light blocking distal end comprises a light transparent core with a bottom surface coated with a light blocking material.

8. The substrate imprint tool of claim 1, wherein the light blocking distal end comprises metal.

9. The substrate imprint tool of claim 7, wherein the metal is a selected one of chrome, aluminum, titanium, copper, gold and nickel.

* * * * *